US010861564B2

(12) United States Patent
 Lin et al.

(10) Patent No.: US 10,861,564 B2
(45) Date of Patent: Dec. 8, 2020

(54) MEMORY CIRCUIT AND DATA BIT STATUS DETECTOR THEREOF

(71) Applicant: Winbond Electronics Corp., Taichung (TW)

(72) Inventors: Zhe-Yi Lin, Taichung (TW);
 Wen-Chiao Ho, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/162,418

(22) Filed: Oct. 17, 2018

(65) Prior Publication Data
 US 2020/0126627 A1 Apr. 23, 2020

(51) Int. Cl.
 *G11C 16/28* (2006.01)
 *G11C 7/06* (2006.01)
 *G11C 16/10* (2006.01)
 *G11C 16/34* (2006.01)

(52) U.S. Cl.
 CPC .............. *G11C 16/28* (2013.01); *G11C 7/062* (2013.01); *G11C 16/10* (2013.01); *G11C 16/34* (2013.01)

(58) Field of Classification Search
 CPC ................................ G11C 16/28; G11C 7/062
 USPC ...................................................... 365/210.1
 See application file for complete search history.

(56) References Cited

U.S. PATENT DOCUMENTS

| 5,606,717 | A | 2/1997 | Farmwald et al. |
| 6,418,059 | B1 | 7/2002 | Kreifels et al. |
| 7,075,842 | B2 * | 7/2006 | Tzartzanis ............. G11C 7/062 365/185.2 |
| 7,242,623 | B2 | 7/2007 | Cohen |
| 7,394,285 | B2 | 7/2008 | Oh et al. |
| 7,580,322 | B2 | 8/2009 | Im |
| 7,715,265 | B2 * | 5/2010 | Buer ...................... G11C 17/18 365/185.28 |
| 7,724,570 | B1 | 5/2010 | Lindhorst et al. |

(Continued)

FOREIGN PATENT DOCUMENTS

| CN | 104081462 | 10/2014 |
| TW | 200845005 | 11/2008 |

(Continued)

OTHER PUBLICATIONS

"Office Action of Taiwan Counterpart Application," dated Mar. 26, 2019, p. 1-p. 4.

*Primary Examiner* — Muna A Techane
(74) *Attorney, Agent, or Firm* — JCIPRNET

(57) ABSTRACT

A memory circuit and a data bit status detector thereof are provided. The data bit status detector includes a sense amplifying circuit, a data receiving circuit, and a reference circuit. The sense amplifying circuit has a first sense input end and a second sense input end. The sense amplifying circuit senses and amplifies a difference between a first impedance on the first sense input end and a second impedance on the second sense input end to generate a sensing output signal. The data receiving circuit receives a plurality of bits of a data signal and provides the first impedance between the first sense input end and a reference grounding end according to the bits of the data signal. The reference circuit receives a plurality of bias voltages and provides the second impedance between the second sense input end and the reference grounding end according to the bias voltages.

10 Claims, 4 Drawing Sheets

(56) References Cited

U.S. PATENT DOCUMENTS

| | | | |
|---|---|---|---|
| 8,327,062 B2 | 12/2012 | Otterstedt et al. | |
| 2002/0021605 A1* | 2/2002 | Harada | G11C 29/24 |
| | | | 365/201 |
| 2009/0207642 A1* | 8/2009 | Shimano | G11C 8/04 |
| | | | 365/72 |
| 2014/0140144 A1* | 5/2014 | Nakazato | G11C 7/06 |
| | | | 365/189.02 |
| 2016/0042785 A1* | 2/2016 | Rim | G11C 11/412 |
| | | | 365/156 |

FOREIGN PATENT DOCUMENTS

| | | |
|---|---|---|
| TW | I338303 | 3/2011 |
| TW | 201123203 | 7/2011 |

\* cited by examiner

MEMORY CIRCUIT AND DATA BIT STATUS DETECTOR THEREOF

BACKGROUND

Technical Field

The disclosure relates to a memory circuit and a data bit status detector thereof. More particularly, the disclosure relates to a data bit status detector in an analog circuit form.

Description of Related Art

In the technical field of flash memory, when a data signal is required to be written in the flash memory, the number of bits at the logic level 0 in the data signal may be determined, and the capability of programming may be set according to the number of bits at the logic level 0 in the data signal to execute the programming operation. In the related art, the data signal may be read from one static random access memory, and the number of bits at the logic level 0 in the data signal is calculated through a bit counter in the logic circuit form. In addition, in the flash memory provided by the related art, the driving capability of the drain voltage generated by a drain boosting circuit may be adjusted according to the calculated number of bits at the logic level 0, so as to effectively complete the programming (writing) operation of the data signal.

In the flash memory of another type provided by the related art, two data signals, for example, two 8-bit data signals, may be read from the static random access memory, and the two data signals may be combined into a 16-bit data signal. The following programming operation may then be executed according to the number of bits at the logic level 0 in the 16-bit data signal.

In any case, in the flash memory provided by the related art, the bit counter circuit used to calculate the number of bits at the logic level 0 in the data signal is required. In order to accurately calculate the number of bits at the logic level 0, a complicated logic circuit design is required to constitute the bit counter circuit, and further, a large circuit area is occupied in the related art.

SUMMARY

The disclosure provides a memory circuit and a data bit status detector thereof herein the data bit status detector is constructed in an analog circuit form so that a required circuit area is effectively reduced.

A data bit status detector in an embodiment of the disclosure includes a sense amplifying circuit, a data receiving circuit, and a reference circuit. The sense amplifying circuit has a first sense input end and a second sense input end. The sense amplifying circuit senses and amplifies a difference between a first impedance on the first sense input end and a second impedance on the second sense input end to generate a sensing output signal. The data receiving circuit receives a plurality of bits of a data signal and provides the first impedance between the first sense input end and a reference grounding end according to the bits of the data signal. The reference circuit receives a plurality of bias voltages and provides the second impedance between the second sense input end and the reference grounding end according to the bias voltages.

A memory circuit provided in an embodiment of the disclosure includes the data bit status detector and a multiplexer circuit. The multiplexer circuit is coupled to a plurality of memory cell arrays and the data bit status detector, and is configured to select each of the memory cell arrays in sequence according to the sensing output signal, or configured to simultaneously select the memory cell arrays to perform a programming operation.

Based on the above, in the embodiments of the disclosure, through the data bit status detector in the analog circuit form, the first impedance is provided according to the data signal through the data receiving circuit, and the first impedance is compared with the second impedance acting as a reference impedance to determine the status of the logic level of the data signal and accordingly generate the sensing output signal. In this way, complexity of circuit setting may be simplified, and the required circuit area is effectively reduced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
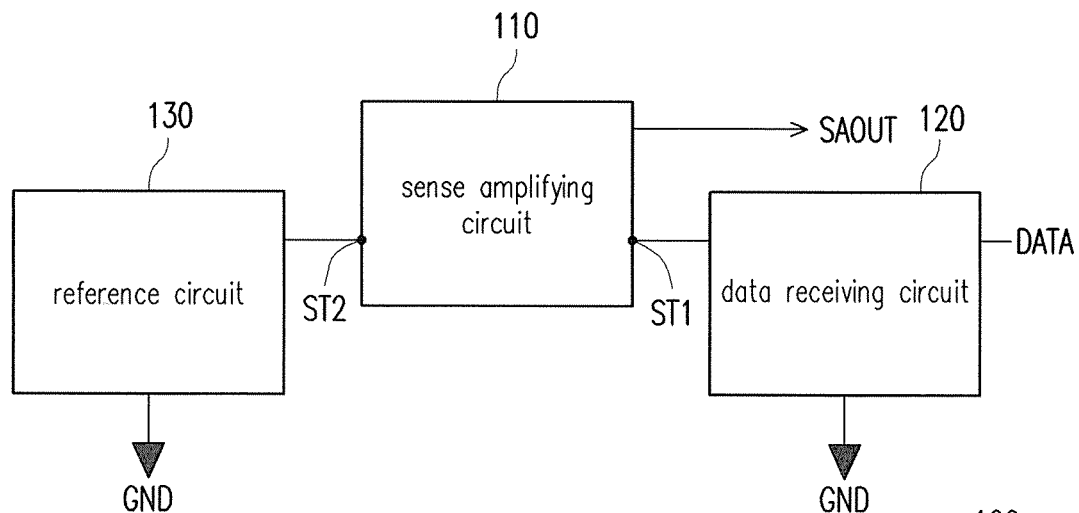
FIG. 1 is a schematic view illustrating a data bit status detector according to an embodiment of the disclosure.

FIG. 1 is a schematic view illustrating a data bit status detector according to an embodiment of the disclosure. With reference to FIG. 1, a data bit status detector 100 includes a sense amplifying circuit 110, a data receiving circuit 120, and a reference circuit 130. The sense amplifying circuit 110 has a first sense input end ST1 and a second sense input end ST2. The sense amplifying circuit 110 is configured to sense and amplify a difference between a first impedance on the first sense input end ST1 and a second impedance on the second sense input end ST2 to generate a sensing output signal SAOUT. The data receiving circuit 120 is coupled between the first sense input end ST1 and a reference grounding end GND. The data receiving circuit 120 receives a data signal DATA and provides the first impedance between the first sense input end ST1 and the reference grounding end GND according to a plurality of bits of the data signal DATA. The reference circuit 130 is coupled between the second sense input end ST2 and the reference grounding end GND. The reference circuit 130 receives a plurality of bias voltages and provides the second impedance between the second sense input end ST2 and the reference grounding end GND according to the bias voltages.

To be specific, the data receiving circuit 120 may provide the first impedance according to a number of bits at a logic level 0 in a plurality of bits of the received data signal DATA. From another perspective, the reference circuit 130 provides the second impedance according to a plurality of preset bias voltages. In this way, the sense amplifying circuit 110 may obtain that whether the number of bits at the logic level 0 in the data signal DATA is greater than a reference value through comparing the first impedance provided by the data receiving circuit 120 with the second impedance provided by the reference circuit 130. The reference value may be configured through setting the magnitude of the second impedance.

The data signal DATA is exemplified as storing 16 bits. In the embodiments of the disclosure, an impedance value of the first impedance provided by the data receiving circuit 120 is R1 if 8 or less bits at the logic level 0 are stored in the data signal DATA, and the impedance value of the first impedance provided by the data receiving circuit 120 is R2 if more than 8 bits at the logic level 0 are stored in the data signal DATA. From another perspective, the reference circuit 130 may be configured as the second impedance capable of providing an impedance value between R1 and R2 according to the received bias voltages. In this way, the data bit status detector 100 may be configured to detect that whether the number of bits at the logic level 0 is greater than 8 in the received data signal DATA and generates the sensing output signal SAOUT equal to a first logic level when more than 8 bits at the logic level 0 are included in the data signal DATA. Also, when 8 or less bits at the logic level 0 are stored in the data signal DATA, the data bit status detector 100 may generate the sensing output signal SAOUT equal to a second logic level. Herein, the first logic level and the second logic level are different.

Figure 2:
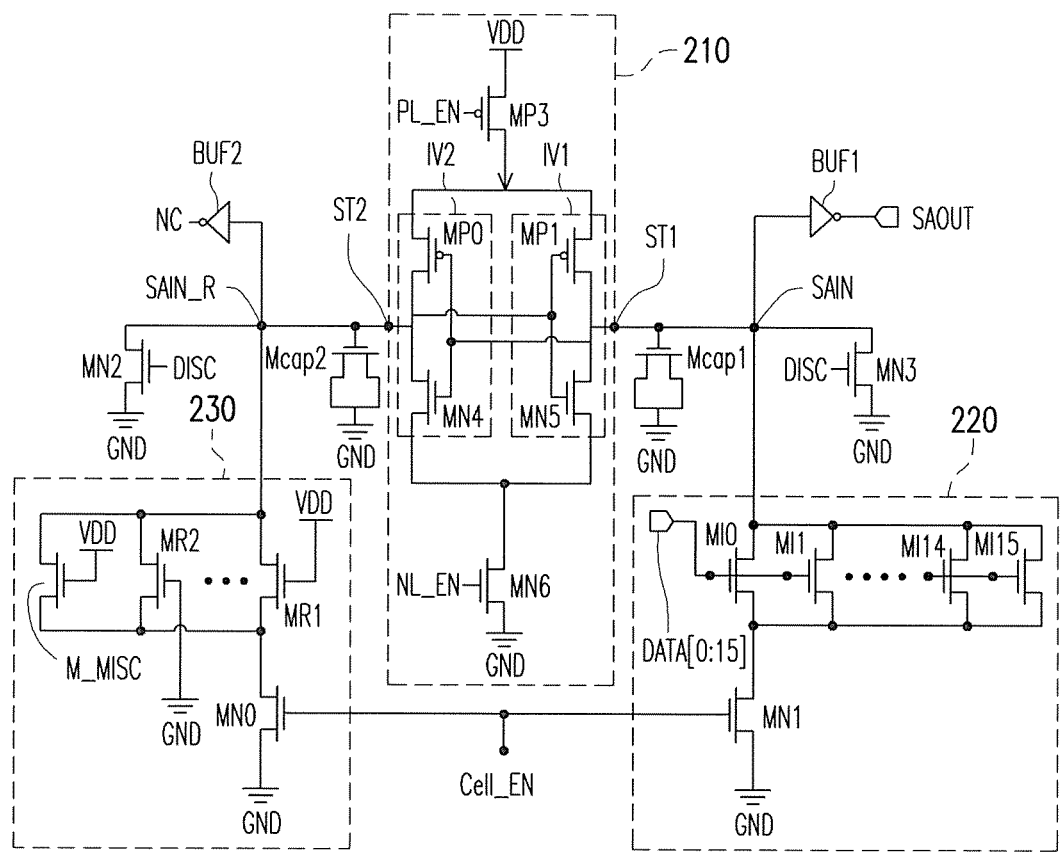
FIG. 2 is a schematic view illustrating a data bit status detector according to another embodiment of the disclosure.

FIG. 2 is a schematic view illustrating a data bit status detector according to another embodiment of the disclosure. With reference to FIG. 2, a data bit status detector 200 includes a sense amplifying circuit 210, a data receiving circuit 220, and a reference circuit 230. The sense amplifying circuit 210 has the first sense input end ST1 and the second sense input end ST2. The sense amplifying circuit 210 includes an inverter IV1 and an inverter IV2. An input end of the inverter IV1 is coupled to the second sense input end ST2, and an output end of the inverter IV1 is coupled to the first sense input end ST1. An input end of the inverter IV2 is coupled to the first sense input end ST1, and an output end of the inverter IV2 is coupled to the second sense input end ST2. Further, the inverter IV1 is constituted by a transistor MP1 and a transistor MN5, and the inverter IV2 is constituted by a transistor MP0 and a transistor MN4.

The sense amplifying circuit 210 additionally includes an enable switch constituted by a transistor MP3 and a transistor MN6. The transistor MP3 is controlled by an upper end enable signal PL_EN to be turned on or off, and the inverter IV1 and the inverter IV2 receive a power source voltage VDD through the transistor MP3. The transistor MN6 is controlled by a lower end enable signal NL_EN to be turned on or off, and the inverter IV1 and the inverter IV2 is coupled to the reference grounding end GND through the transistor MN6 and receives a reference grounding voltage.

The data receiving circuit 220 is coupled to the first sense input end ST1 of the sense amplifying circuit 210. The data receiving circuit 220 includes a plurality of transistors MI0 to MI15. The transistors MI0 to MI15 are coupled to one another in parallel and are coupled between the first sense input end ST1 and the reference grounding end GND. Control terminals of the transistors MI0 to MI15 are individually controlled by a plurality of bits DATA[0:15] of the data signal and provide the first impedance between the first sense input end ST1 and the reference grounding end GND according to the bits DATA[0:15] of the data signal.

From another perspective, the data receiving circuit 220 additionally includes a pull-down switch constituted by a transistor MN1. The transistor MN1 is connected in series between a path through which the transistors MI0 to MI15 are coupled to the reference grounding end GND. The transistor MN1 is controlled by an enable signal Cell_EN to be turned on or off.

The reference circuit 230 is coupled to the second sense input end ST2 of the sense amplifying circuit 210. The reference circuit 230 includes a plurality of transistors MR1 to MR2. The transistors MR1 to MR2 are coupled to each other in parallel and are coupled between the second sense input end ST2 and the reference grounding end GND. Control terminals of the transistors MR1 to MR2 individually receive different bias voltages (the control terminal of the transistor MR1 receives the power source voltage VDD as the bias voltage, and the control terminal of the transistor MR2 is coupled to the reference grounding end GND to receive the reference grounding voltage GND as the bias voltage) and provide the second impedance between the second sense input end ST2 and the reference grounding end GND. In the embodiments of the disclosure, the reference circuit 230 further includes another transistor M_MISC. The transistor M_MISC is coupled to the transistors MR1 to MR2 in parallel, and a control terminal of the transistor M_MISC receives the power source voltage VDD as the bias voltage.

From another perspective, the reference circuit 230 additionally includes a pull-down switch constituted by a transistor MN0. The transistor MN0 is connected in series between a path through which the transistors MR1 to MR2 are coupled to the reference grounding end GND. The transistor MN0 is controlled by the enable signal Cell_EN to be turned on or off.

In this embodiment, a number of the transistor MR1 and a number of the transistor MR2 may both be one or more than one, and a total number of the transistors MR1 and MR2 may be identical to a total number of the transistors MI0 to MI15. In addition, on and off statuses of the transistors MN0 and MN1 are identical.

In the embodiments of the disclosure, the data bit status detector 200 further includes capacitors Mcap1 and Mcap2, discharge switches constituted by transistors MN2 and MN3, and output buffers BUF1 and BUF2. The capacitor Mcap1 and the capacitor Mcap2 may both be transistor capacitors and are respectively coupled to the first sense input end ST1 and the second sense input end ST2. The discharge switch constituted by the transistor MN3 is connected in series between the first sense input end ST1 and the reference grounding end GND and is switched on or off according to a discharge enable signal DISC. The discharge switch constituted by the transistor MN2 is connected in series between the second sense input end ST2 and the reference grounding end GND and is switched on or off according to the discharge enable signal DISC. When the transistors MN3 and MN2 are turned on, the capacitors Mcap1 and Mcap2 perform discharging and pull down voltage values on the first sense input end ST1 and the second sense input end ST2.

The output buffer BUF1 and the output buffer BUF2 are respectively coupled to the first sense input end ST1 and the second sense input end ST2. The output buffers BUF1 and BUF2 are inverters, and the output buffers BUF1 and BUF2 are configured to invert logic levels on the first sense input end ST1 and the second sense input end ST2. Herein, the output buffer BUF1 is configured to generate the sensing output signal SAOUT. The output buffer BUF2 may maintain to be floated to be connected to a no connecting (NC) terminal.

Figure 3A:
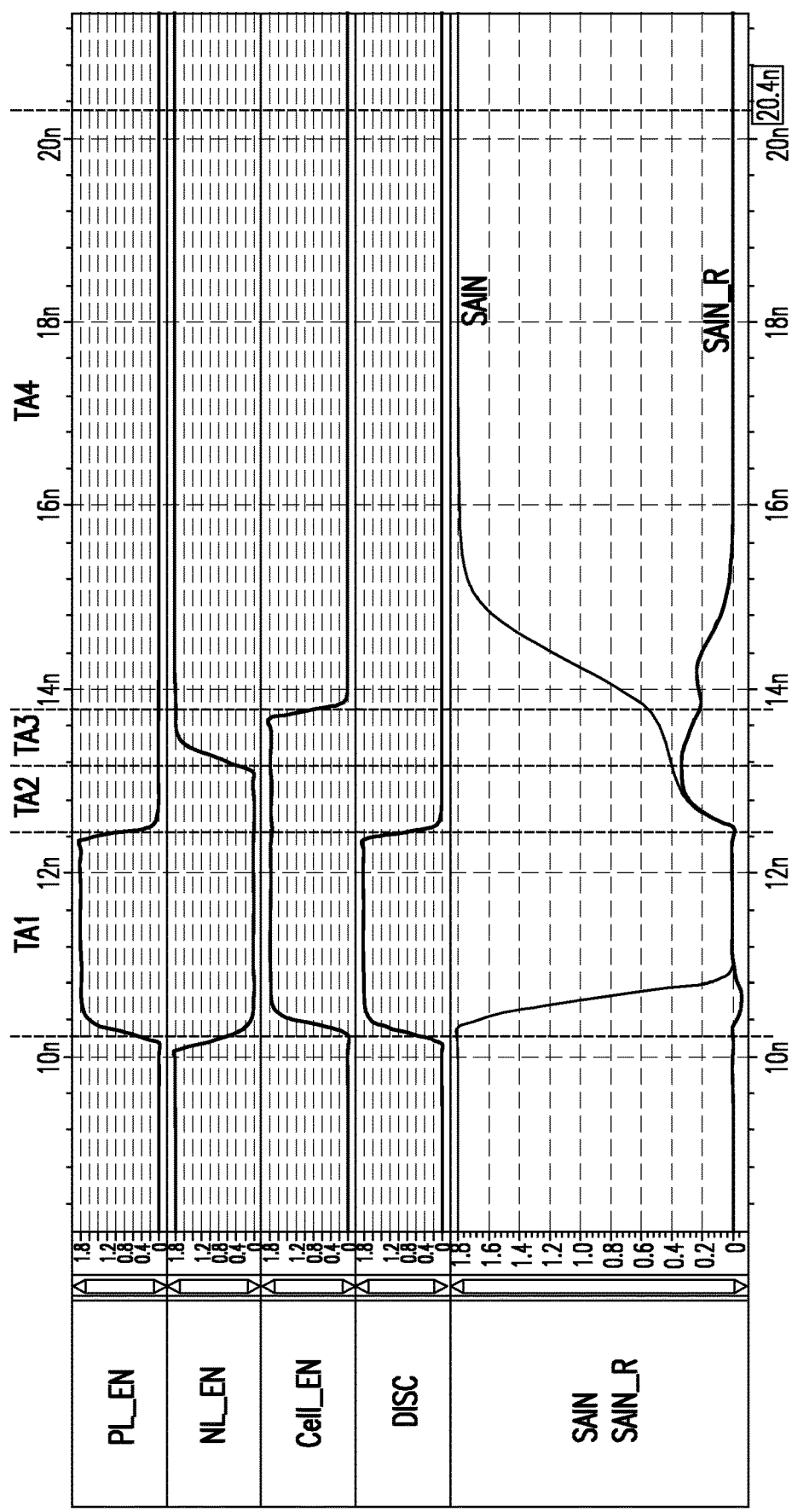
FIG. 3A and FIG. 3B are diagrams illustrating operational wave forms of the data bit status detector in different operational statues according to an embodiment of the disclosure.
Figure 3B:
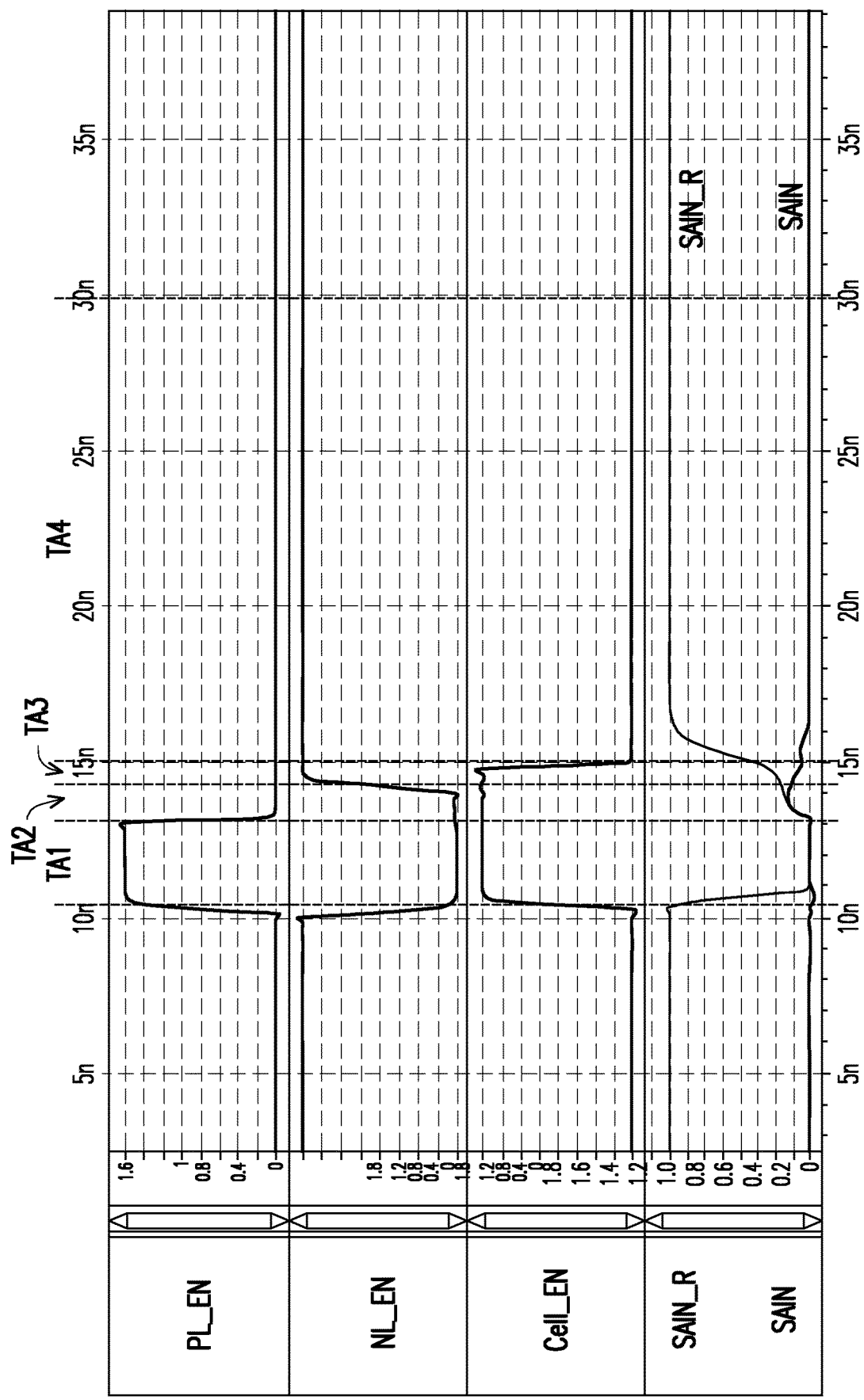

FIG. 3A and FIG. 3B are diagrams illustrating operational wave forms of the data bit status detector in different operational statues according to an embodiment of the disclosure. Operations of the data bit status detector 200 are described in detail below. With reference to FIG. 2 and FIG. 3A together, in a time interval TA1, the upper end enable signal PL_EN is pulled up to a logic high level, and the lower end enable signal NL_EN is pulled down to a logic low level. Accordingly, the transistor MP3 acting as the enable switch is turned on, and the transistor MN6 is turned off. Also in the time interval TA1, the enable signal Cell_EN is pulled up to the logic high level, the transistors MN0 and MN1 are turned on, and paths through which the reference circuit 230 and the data receiving circuit 220 are connected to the reference grounding voltage GND are turned on. In addition, the discharge enable signal DISC is pulled up to the logic high level in the time interval TA1, the transistors MN2 and MN3 are turned on, and voltages SAIN and SAIN_R respectively on the first sense input end ST1 and the second sense input end ST2 are pulled down.

In the embodiments of the disclosure, the reference circuit 230 includes eight transistors MR1 and eight transistors MR2. The transistors MR1 receive the bias voltages equal to the power source voltage VDD, and the transistors MR2 receive the bias voltages equal to the reference grounding voltage. The data receiving circuit 220 receives the data signal storing 16 bits DATA[0:15].

In a time interval TA2 after the time interval TA1, the upper end enable signal PL_EN and the discharge enable signal DISC are pulled down to the logic low level, and the enable signal Cell_EN maintains to be at the logic high level. At the same time, if the first impedance provided by the data receiving circuit 220 is greater than the second impedance provided by the reference circuit 230 (that is, the number of bits at the logic level 0 is greater than 8 in the bits DATA[0:15] of the data signal), the sense amplifying circuit 210 activates a sense amplifying operation, pulls down the voltage SAIN_R on the second sense input end ST2 according to the magnitude relationship between the first impedance and the second impedance, and simultaneously pulls up the voltage SAIN on the first sense input end ST1.

In a time interval TA3 after the time interval TA2, the upper end enable signal PL_EN maintains to be at the logic low level (the transistor MP3 is turned on), and the lower end enable signal NL_EN is pulled up to the logic high level so that the transistor MN6 is turned on, a rising rate of the voltage SAIN is increased, and a falling rate of the voltage SAIN_R is accelerated at the same time.

In a time interval TA4 after the time interval TA3, a voltage value of the voltage SAIN rises above a threshold voltage of the inverter IV2. Hence, the voltage SAIN is rapidly pulled up to the logic high level in the time interval TA4, and correspondingly, the voltage SAIN_R is rapidly pulled down to the logic low level in the time internal TA4.

In the time interval TA4, the voltage SAIN_R equal to the logic low level and the voltage SAIN equal to the logic high level are latched in the sense amplifying circuit 210 and output the sensing output signal SAOUT through the output buffer BUF1.

In FIG. 3B. Operations in the time interval TA1 are identical to that described in FIG. 3A. In the time interval TA2 after the time interval TA1, the upper end enable signal PL_EN and the discharge enable signal DISC are pulled down to the logic low level, and the enable signal Cell_EN maintains to be at the logic high level. At the same time, if the first impedance provided by the data receiving circuit 220 is less than the second impedance provided by the reference circuit 230 (that is, the number of bits at the logic level 0 is less than or equal to 8 in the bits DATA[0:15] of the data signal), the sense amplifying circuit 210 activates the sense amplifying operation, pulls up the voltage SAIN_R on the second sense input end ST2 according to the magnitude relationship between the first impedance and the second impedance, and simultaneously pulls down the voltage SAIN on the first sense input end ST1.

In the time interval TA3 after the time interval TA2, the upper end enable signal PL_EN is pulled up to the logic low level (the transistor MP3 is turned on), and the lower end enable signal NL_EN is pulled up to the logic high level so that the transistor MN6 is turned on, thereby a falling rate of the voltage SAIN is increased, and a rising rate of the voltage SAIN_R is accelerated at the same time.

In the time interval TA4 after the time interval TA3, a voltage value of the voltage SAIN_R rises above a threshold voltage of the inverter IV1. Hence, the voltage SAIN_R is rapidly pulled up to the logic high level in the time interval TA4, and correspondingly, the voltage SAIN is rapidly pulled down to the logic low level in the time internal TA4.

Figure 4:
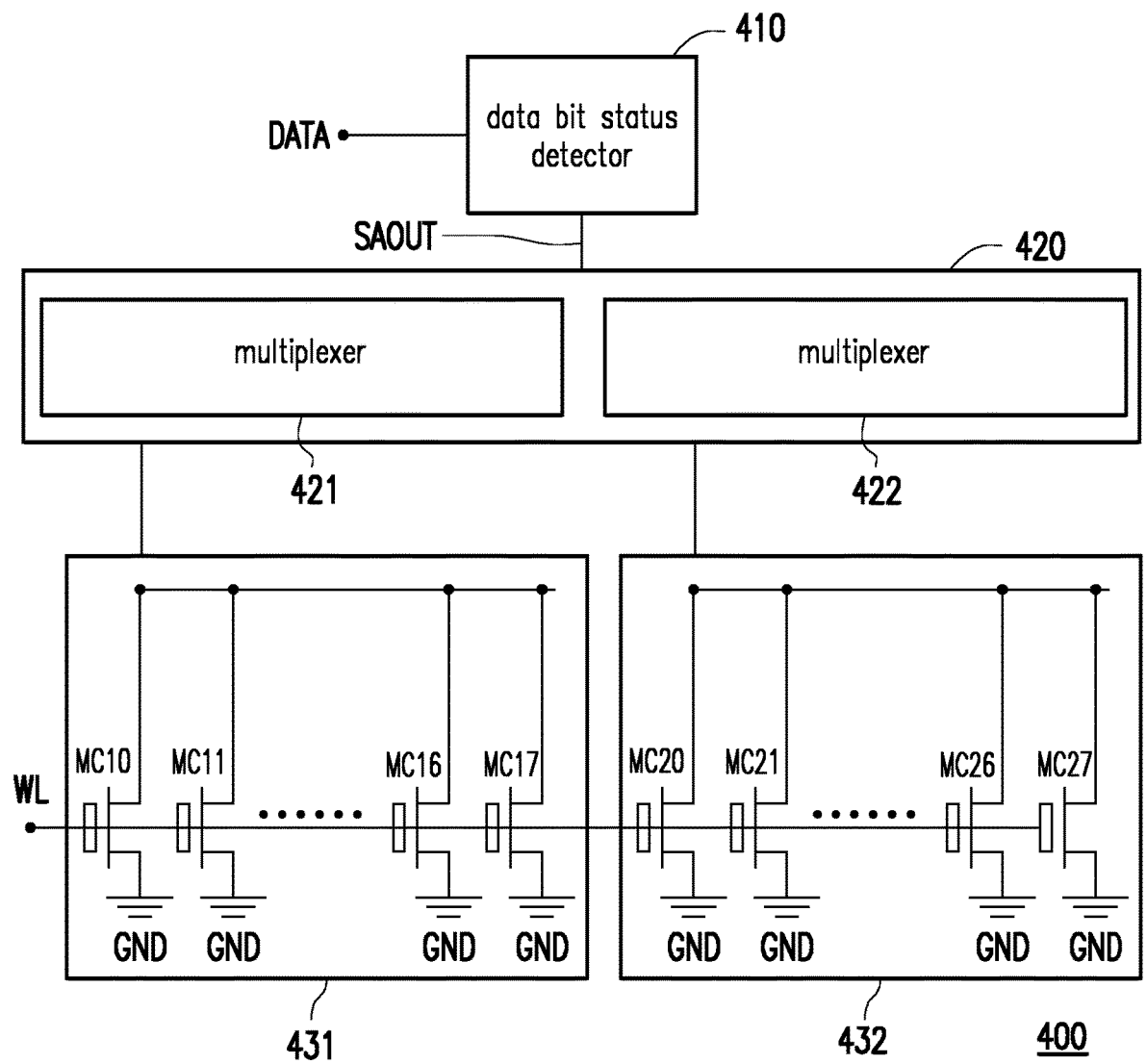
FIG. 4 is a schematic diagram illustrating a memory circuit according to an embodiment of the disclosure.

With reference to FIG. 4, FIG. 4 is a schematic diagram illustrating a memory circuit according to an embodiment of the disclosure. A memory circuit 400 includes memory cell arrays 431 and 432, a multiplexer circuit 420, and a data bit status detector 410. The data bit status detector 410 is coupled to the multiplexer circuit 420. The data bit status detector 410 receives the data signal DATA to be programmed (written) and determines a logic level status of the bits of the data signal DATA to generate the sensing output signal SAOUT. The multiplexer circuit 420 includes a multiplexer 421 and a multiplexer 422. The multiplexer 421 and the multiplexer 422 are respectively coupled to the memory cell array 431 and the memory cell array 432. The multiplexer circuit 420 receives the sensing output signal SAOUT and determines to activate the memory cell arrays 431 and 432 simultaneously or activates the memory cell arrays 431 and 432 in sequence according to the sensing output signal SAOUT, so as to perform a programming operation on memory cells MC10 to MC17 in the memory cell array 431 and memory cells MC20 to MC27 in the memory cell array 432.

Note that when the data bit status detector 410 determines that the number of bits at the logic level 0 is greater than 8 in the data signal DATA, it means that more data bits are required to be written so higher electricity is required to be consumed. Therefore, the multiplexers 421 and 422 are turned on in sequence (turn on one at a time), and the memory cell arrays 431 and 432 perform the programming operation in sequence. Correspondingly, when the data bit status detector 410 determines that the number of bits at the logic level 0 is less than or equal to 8 in the data signal DATA, it means that less data bits are required to be written so lower electricity is required to be consumed. Therefore, the multiplexers 421 and 422 may be turned on simultaneously, and the memory cell arrays 431 and 432 perform the programming operation simultaneously.

In the embodiments of the disclosure, gates of the memory cells MC10 to MC27 are coupled to a word line WL, and the memory cells required to be programmed are selected according to a word line signal on the word line WL to perform the access operation.

In view of the foregoing, in the embodiments of the disclosure, through the data bit status detector in the analog circuit form, the first impedance is generated according to the bit status of the bits of the data signal, and the first impedance is compared with the reference impedance to sense the bit status of the bits of the data signal. In this way, complexity of circuit design may be effectively reduced, the area required by the circuit is reduced, costs of the memory circuit are decreased, and product competitiveness is therefore increased.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A data bit status detector, comprising:
    a sense amplifying circuit, having a first sense input end and a second sense input end, sensing and amplifying a difference between a first impedance on the first sense input end and a second impedance on the second sense input end to generate a sensing output signal;
    a data receiving circuit, receiving a plurality of bits of a data signal, providing the first impedance between the first sense input end and a reference grounding end according to the plurality of bits of the data signal;
    a reference circuit, receiving a plurality of bias voltages, providing the second impedance between the second sense input end and the reference grounding end according to the plurality of bias voltages,
    wherein the data receiving circuit comprises a plurality of first transistors, each one of the plurality of first transistors is connected in parallel between the first sense input end and the reference grounding end, and control terminals of the plurality of first transistors respectively receive the plurality of bits of the data signal;
    a first capacitor, connected in series between the first sense input end and the reference grounding end; and
    a second capacitor, connected in series between the second sense input end and the reference grounding end.

2. The data bit status detector as claimed in claim 1, wherein the reference circuit comprises a plurality of second transistors, the plurality of second transistors are coupled to one another in parallel between the second sense input end and the reference grounding end, and control terminals of the plurality of second transistors respectively receive the plurality of bias voltages;
    wherein each of the plurality of bias voltages is a power source voltage or a reference grounding voltage.

3. The data bit status detector as claimed in claim 2, wherein a number of the plurality of second transistors and a number of the plurality of first transistors are identical.

4. The data bit status detector as claimed in claim 2, wherein the reference circuit further comprises:
    a third transistor, coupled to each of the plurality of second transistors in parallel, a control terminal of the third transistor receiving the power source voltage.

5. The data bit status detector as claimed in claim 2, wherein the data receiving circuit further comprises:
    a first pull-down switch, coupled between the data receiving circuit and the reference grounding end to be switched on or off according to an enable signal,
    wherein the reference circuit further comprises:
    a second pull-down switch, coupled between the reference circuit and the reference grounding end to be switched on or off according to the enable signal.

6. The data bit status detector as claimed in claim 1, further comprising:
    a first discharge switch, connected in series between the first sense input end and the reference grounding end to be switched on or off according to a discharge enable signal; and
    a second discharge switch, connected in series between the second sense input end and the reference grounding end to be switched on or off according to the discharge enable signal.

7. The data bit status detector as claimed in claim 1, wherein the sense amplifying circuit comprises:
    a first inverter, having an input end coupled to the second sense input end, an output end of the first inverter being coupled to the first sense input end; and
    a second inverter, having an input end coupled to the first sense input end, an output end of the second inverter being coupled to the second sense input end.

8. The data bit status detector as claimed in claim 7, wherein the sense amplifying circuit further comprises:
    a first enable switch, controlled by an upper end enable signal to be switched on or off, wherein the first inverter and the second inverter receive a power source voltage through the first enable switch; and
    a second enable switch, controlled by a lower end enable signal to be switched on or off, wherein the first inverter and the second inverter receive a reference grounding voltage through the second enable switch.

9. The data bit status detector as claimed in claim 1, further comprising:
    a first output buffer, an input end of the first output buffer being coupled to the first sense input end, an output end of the first output buffer generating the sensing output signal; and
    a second output buffer, an input end of the second output buffer being coupled to the second sense input end, an output end of the second output buffer being floated.

10. A memory circuit, comprising:
    the data bit status detector as claimed in claim 1; and
    a multiplexer circuit, coupled to a plurality of memory cell arrays and the data bit status detector, configured to select each of the memory cell arrays in sequence according to the sensing output signal or configured to simultaneously select the memory cell arrays to perform a programming operation.

* * * * *